United States Patent
Melanson (10) Patent No.: US 6,844,840 B1
(45) Date of Patent: Jan. 18, 2005

(54) SUCCESSIVE-APPROXIMATION-REGISTER (SAR) ANALOG-TO-DIGITAL CONVERTER (ADC) AND METHOD UTILIZING N THREE-WAY ELEMENTS

(75) Inventor: John L. Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 10/684,997

(22) Filed: Oct. 14, 2003

(51) Int. Cl.[7] .............................................. H03M 1/38
(52) U.S. Cl. ...................................... 341/161; 341/155
(58) Field of Search ................................. 341/161, 155

(56) References Cited

U.S. PATENT DOCUMENTS 5,428,769 A * 6/1995 Glaser et al. .................. 700/4

* cited by examiner

*Primary Examiner*—Brian Young
(74) *Attorney, Agent, or Firm*—Steven Lin, Esq.

(57) ABSTRACT

A successive-approximation-register (SAR) analog-to-digital converter (ADC) and method utilizing N three-way elements are disclosed. The SAR ADC has a SAR logic system that implements an efficient search algorithm. The search algorithm involves initializing each of N three-way elements of a digital-to-analog converter (DAC) for the SAR ADC to a middle reference voltage. Each of the N three-way elements is able to be set to one of three values: a high reference voltage, a middle reference voltage, or a low reference voltage. The search algorithm determines and sets each of the N three-way elements from the middle reference voltage to either the high reference voltage or the low reference voltage depending upon a comparison result between an analog input value of the SAR ADC and a DAC voltage value.

17 Claims, 5 Drawing Sheets

SUCCESSIVE-APPROXIMATION-REGISTER (SAR) ANALOG-TO-DIGITAL CONVERTER (ADC) AND METHOD UTILIZING N THREE-WAY ELEMENTS

BACKGROUND OF THE INVENTION

1. Field of the Invention

The present invention relates to data converters, and, more particularly, to a successive-approximation-register (SAR) analog-to-digital converter (ADC) and method.

2. Description of Related Art

Data converters, such as analog-to-digital converters (ADCs) and digital-to-analog converters (DACs), are used for converting data between analog signals and digital signals. ADCs convert analog signals to digital signals. Various types of ADCs exist, such as delta-sigma modulator ADCs or successive-approximation-register (SAR) ADCs.

Figure 1:
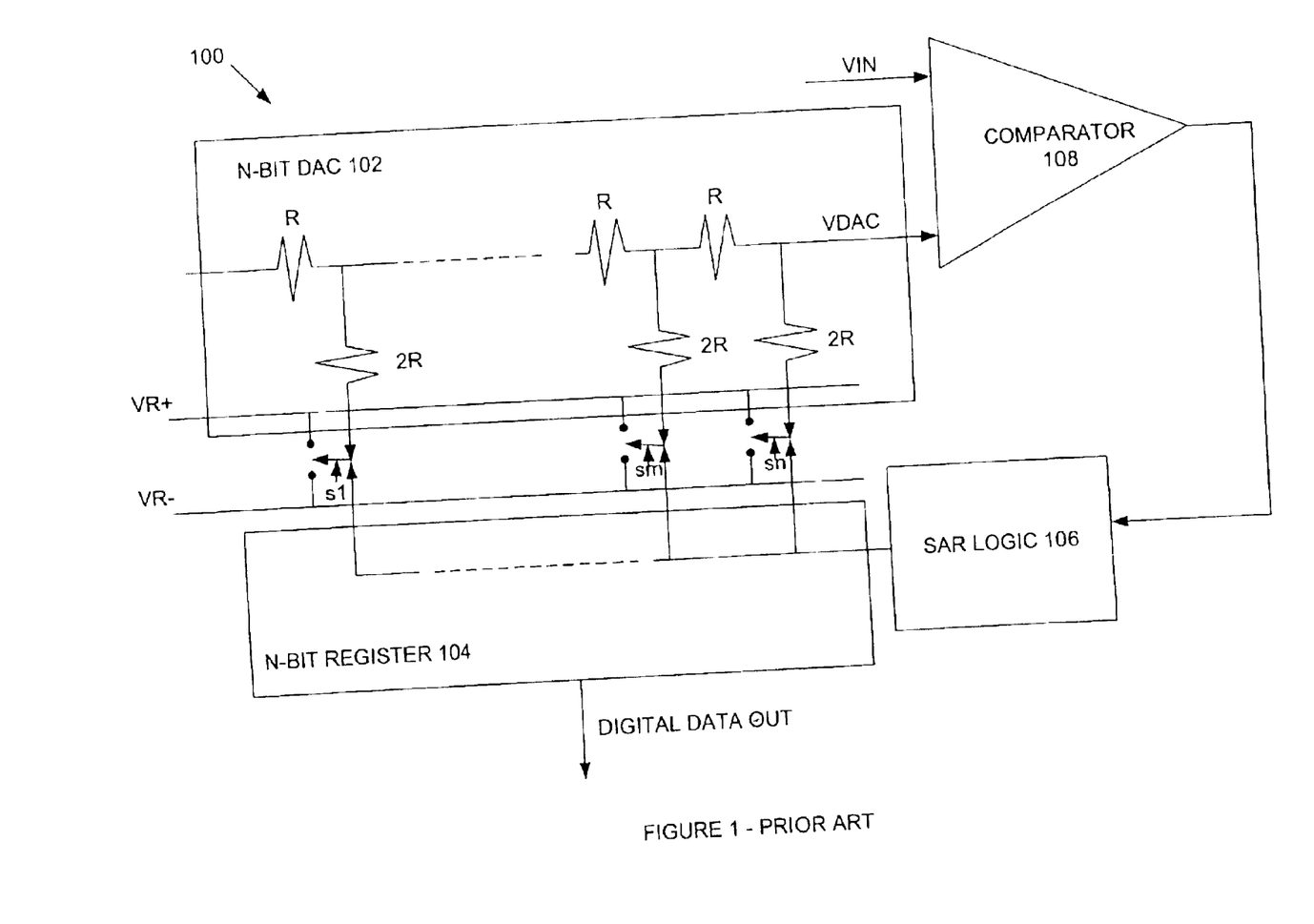
FIG. 1 is a block diagram of an exemplary N-bit successive-approximation-register (SAR) analog-to-digital (ADC) according to the prior art.

With reference now to FIG. 1, a block diagram of an exemplary N-bit SAR ADC 100 according to the prior art is shown in which N is an integer greater than one. SAR ADC 100 includes an N-bit digital-to-analog converter (DAC) 102, an N-bit register 104, and a SAR logic block 106 coupled together as shown in FIG. 1. N-bit DAC 102 includes an R-2R ladder network of resistors R and 2R in order to convert digital signals to analog signals. SAR ADC 100 also has a comparator 108. Comparator 108 receives as one of its input an analog input voltage VIN of an analog input signal received by SAR ADC 100 and further receives as another one of its input a DAC voltage VDAC from N-bit DAC 102. The output of comparator 108 is fed back into SAR logic block 106 as shown in FIG. 1. The converted digital output signal DIGITAL DATA OUT is output from N-bit register 104.

Additionally, each bit of N-bit DAC 102 and N-bit register 104 is coupled to either a high reference voltage VR+ or low reference voltage VR− through a respective switch s1, ..., sm, sn as shown in FIG. 1. For example, if the most significant bits (MSBs) of N-bit DAC 102 and N-bit register 104 are to be set to a high value, then the respective switch s1 switches to couple both MSBs to the reference voltage VR+. On the other hand, if the MSBs are to be set to a low value, then the respective switch s1 switches to couple both MSBs to the reference voltage VR−.

Figure 2:
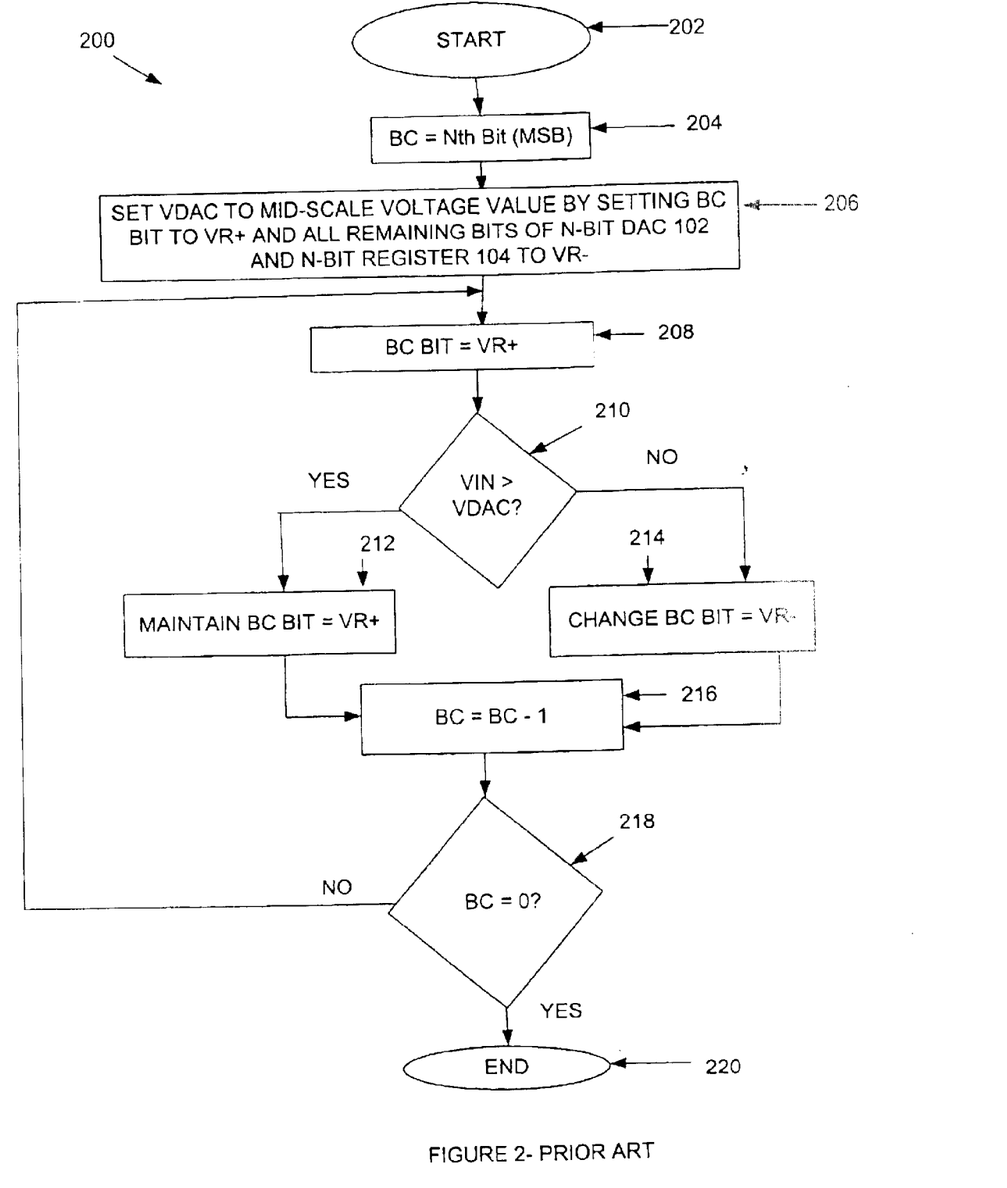
FIG. 2 is a flow chart of an exemplary search algorithm for an N-bit SAR ADC shown in FIG. 1 according to the prior art.

A SAR ADC implements a binary search algorithm for successively approximating the analog input value as a digital output value. Referring now to FIG. 2, a flow chart of an exemplary search algorithm 200 for SAR ADC 100 according to the prior art is shown. Search algorithm 200 starts at block 202 and moves onto block 204, which depicts a bit count BC being initialized and set equal to an Nth bit value and reflects the bit count BC being set to the most significant bit (MSB). Following block 204, block 206 illustrates DAC voltage VDAC being initialized to a mid-scale voltage value by setting the SC bit (e.g., MSB) to the high reference voltage VR+ and all remaining bits of N-bit DAC 102 and N-bit register 104 to the low reference voltage VR−.

Search algorithm 200 then proceeds to block 208, which depicts BC BIT (e.g., the Nth bit or MSB at this time) of N-bit DAC 102 and N-bit register 104 being set equal to the high reference voltage VR+. Following block 208, decision block 210 shows a comparison being made between analog input voltage VIN and DAC voltage VDAC. If analog input voltage VIN is greater than DAC voltage VDAC, then search algorithm 200 next moves to block 212, which shows BC BIT of N-bit DAC 102 and N-bit register 104 being maintained equal to the high reference voltage VR+. Search algorithm 200 then proceeds to block 216. On the other hand, if, at decision block 210, analog input voltage VIN is not greater than DAC voltage VDAC, then search algorithm 200 proceeds to block 214. Block 214 depicts that BC BIT of N-bit DAC 102 and N-bit register 104 being changed to the low reference voltage VR−.

Search algorithm 200 then proceeds to block 216. Block 216 represents the moving to the next bit of N-bit DAC 102 and N-bit register 104 by setting the next value of bit count BC equal to the current bit count BC minus one (1). Following block 216, decision block 218 illustrates a determination whether bit count BC equals zero (0). If bit count BC does not equal zero (0), then search algorithm 200 loops back before block 208 and sets this next BC BIT to the high reference voltage VR+ and continues therefrom. On the other hand, if bit count BC does equal zero (0), then search algorithm 200 ends at block 220.

As an example, if N-bit SAR ADC 100 is a 4-bit SAR ADC (e.g. N=4), then the bit levels for a 4-bit SAR ADC are from 0 to 15. In this example, the voltage VIN equates to a level value of 9.5. The bit count BC is set equal to four (4) at block 204. Also, for this example, a one (1) value is representative of the high reference voltage VR+, and a zero (0) value is representative of the low reference voltage VR−. The voltage VDAC starts at the mid-scale voltage value by setting the bits of N-bit DAC 102 and N-bit register 104 to the value 1000 (e.g., equal to 8) at block 206. Again, BC BIT is set to the one value (e.g., the high reference voltage VR+).

The voltage VIN equal to 9.5 is compared with the voltage VDAC equal to 8. Since 9.5>8 at decision block 210, the BC BIT (e.g., fourth bit) is maintained as one and the voltage VDAC is maintained as 8 at block 212. At block 216, BC is set equal to three (3) (4−1). Since BC is not equal to zero at decision block 218, the new BC BIT (e.g., third bit) is set equal to one at block 208. The voltage VDAC is now equal to 12 (e.g., bits of N-bit DAC 102 and N-bit register 104 are 1100). Since 9.5<12 at decision block 210, the BC BIT (e.g., third bit) is changed back to zero at block 214. BC is then set to 2 (e.g., 3−1) at block 216. Since BC is still not equal to zero at decision block 218, the next BC BIT (e.g., second bit) is set equal to one at block 208.

The voltage VDAC is now equal to 10 (e.g., bits of N-bit DAC 102 and N-bit register 104 are 1010). Since 9.5<10 at decision block 210, the BC BIT (e.g., second bit) is changed back to zero at block 214. BC is then set to 1 (e.g., 2−1) at block 216. Since BC is not equal to zero at decision block 218, the next BC BIT (e.g., first bit) is set equal to one at block 208. Since 9.5>9 at decision block 210, the BC BIT (e.g., first bit) is maintained as one at block 212. BC is then set equal to zero at block 216. Since now BC equals zero at decision block 218, search algorithm 200 ends at block 220.

As illustrated, the above search algorithm requires going through each bit by setting them to a one value and testing to see whether the voltage VIN is greater than the voltage VDAC. If so, then the one value for the bit is kept. However, if the voltage VIN is not greater than the voltage VDAC, then the bit has to be changed back to the zero value. Thus, at times, the voltage values for the bits of the DAC need to be changed back and forth to successively approximate and end up at the desired voltage VDAC.

Thus, search algorithm 200 requires a number of changes to the bits in order to finally reach the right value. For each pass of the operational loop through search algorithm 200, an initialization and setting of a bit value and then possibly another change to the bit value may be performed.

The present invention recognizes the desire and need for a more efficient search algorithm for a successive-approximation-register (SAR) analog-to-digital converter (ADC), which would reduce the number of changes having to be made to the element values. The present invention recognizes the desire and need for reducing the number of steps and operations performed by the search algorithm for the SAR ADC and the number of passes made through the search algorithm loop. The present invention overcomes the problems and disadvantages that have been encountered with the prior art.

SUMMARY OF THE INVENTION

A successive-approximation-register (SAR) analog-to-digital converter (ADC) and method utilizing N three-way elements are disclosed. The SAR ADC has a SAR logic system that implements an efficient search algorithm. The search algorithm involves initializing each of N three-way elements of a digital-to-analog converter (DAC) for the SAR ADC to a middle reference voltage. Each of the N three-way elements is able to be set to one of three values: a high reference voltage, a middle reference voltage, or a low reference voltage. The search algorithm determines and sets each of the N three-way elements from the middle reference voltage to either the high reference voltage or the low reference voltage depending upon a comparison result between an analog input value of the SAR ADC and a DAC voltage value.

The above as well as additional objects, features, and advantages of the present invention will become apparent in the following detailed written description.

BRIEF DESCRIPTION OF THE DRAWINGS

The novel features believed characteristic of the invention are set forth in the appended claims. The invention itself, however, as well as a preferred mode of use, further objects and advantages thereof, will best be understood by reference to the following detailed description of an illustrative embodiment when read in conjunction with the accompanying drawings, wherein:

DETAILED DESCRIPTION OF THE INVENTION

A successive-approximation-register (SAR) analog-to-digital converter (ADC) and method are disclosed. The SAR ADC has a SAR logic system that implements an efficient search algorithm.

Figure 3:
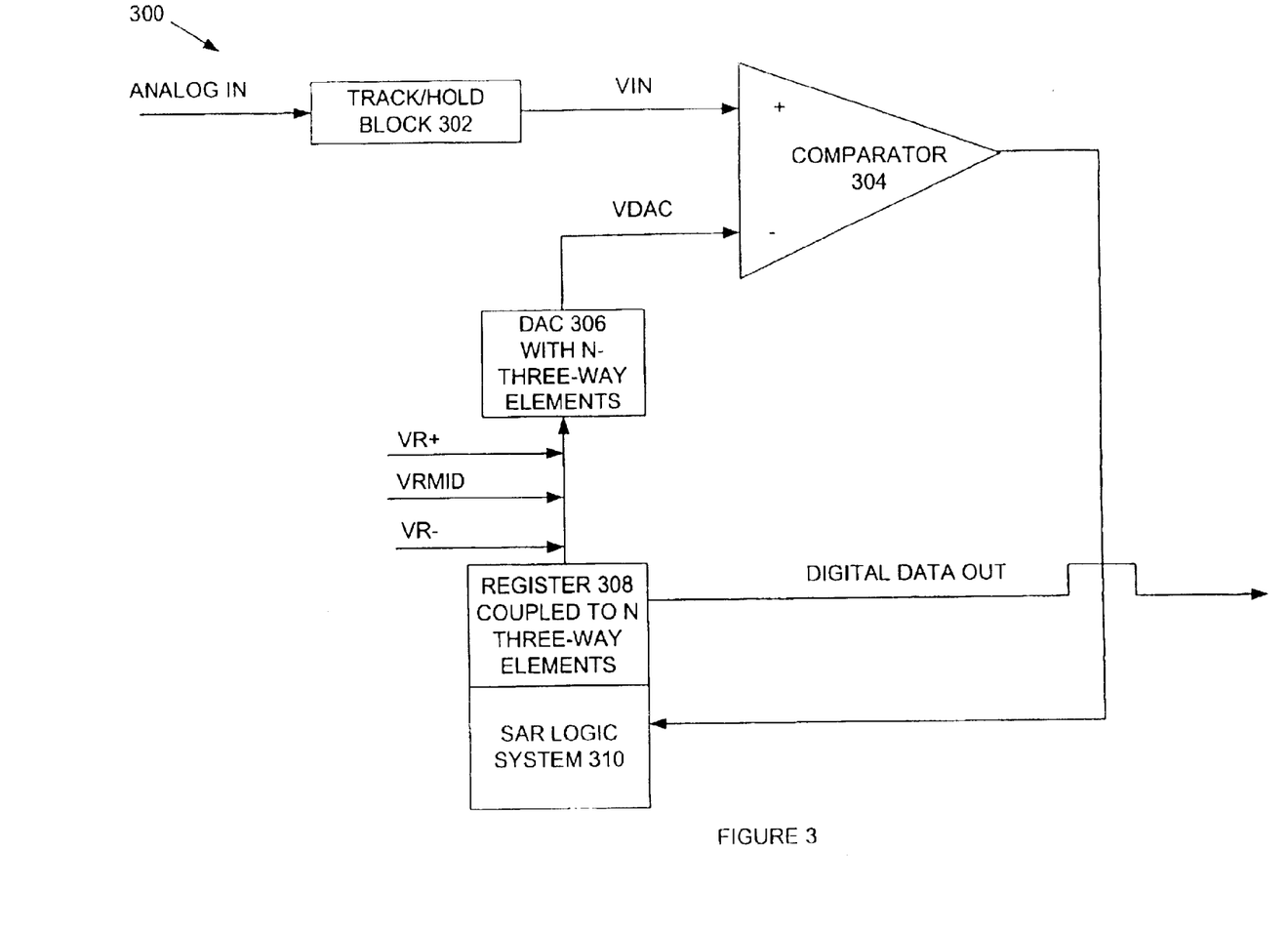
FIG. 3 is a block diagram of an exemplary SAR ADC having a digital-to-analog converter (DAC) with at least N three-way elements according to the present invention.

With reference now to FIG. 3, a block diagram of an exemplary SAR ADC 300 having a digital-to-analog converter (DAC) with at least N three-way elements according to the present invention is shown. N is an integer greater than one. SAR ADC 300 includes a track/hold block 302, a comparator 304, a digital-to-analog converter (DAC) 306 with N three-way elements, a register 308 coupled to the N three-way elements, and a SAR logic system 310 coupled together as shown in FIG. 3. N can be a number that represents all of the DAC elements of DAC 306 or a number less than all of the DAC elements of DAC 306. In the case that N is a number less than all of the DAC elements of DAC 306, another SAR algorithm can be used to determine the values for the remaining elements that are not among the N three-way elements. An analog input signal ANALOG IN is input into track/hold block 302, and track/hold block 302 outputs an analog input voltage VIN. Track/hold block 302 tracks and holds analog input voltages of analog input signal ANALOG IN being input into a positive input of comparator 304. Comparator 304 receives at its negative input a DAC voltage VDAC from DAC 306.

SAR logic system 310 is coupled to register 308, and register 308 drives DAC 306. The N three-way elements of DAC 306 are able to couple to a high reference voltage VR+, a middle reference voltage VRMID, or a low reference voltage VR− as shown in FIG. 3. The highest reference voltage VR+ represents the one or high value for a bit, and the low reference voltage VR− represents the zero or low value for a bit. The middle reference voltage VRMID represents a halfway or middle value between a zero and a one value for a bit (e.g., VRMID=(VR++VR−)/2), and the present invention uniquely utilizes the middle reference voltage VRMID to provide the efficient search algorithm. These voltages will be discussed in more detail later in the specification. The output of comparator 304 is fed back into SAR logic system 310 as shown in FIG. 3. The converted digital output signal DIGITAL DATA OUT is output from register 308.

Figure 4:
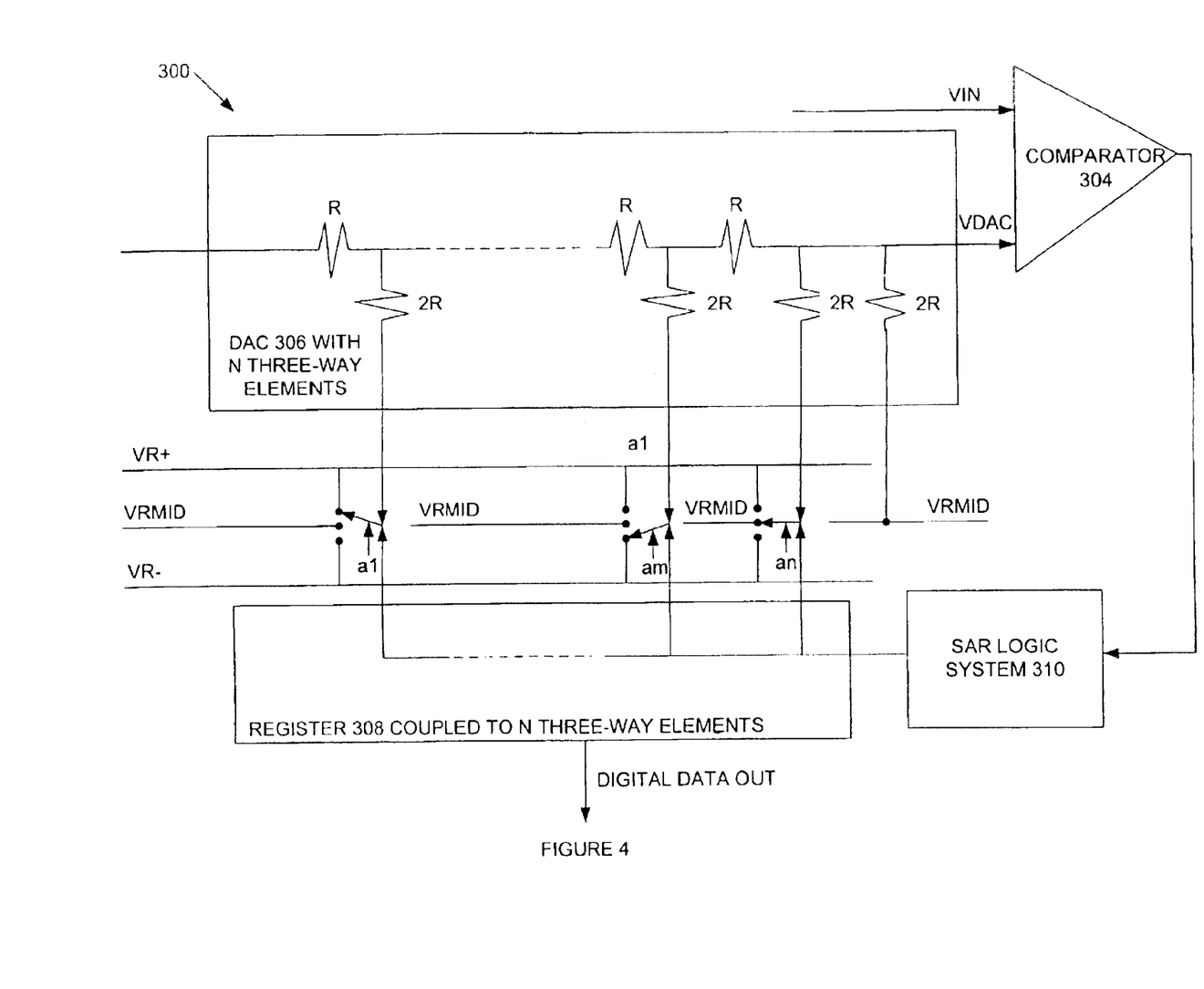
FIG. 4 is a more detailed block diagram of the SAR ADC of FIG. 3 showing details of the DAC with at least the N three-way elements.

Referring now to FIG. 4, a more detailed block diagram of exemplary SAR ADC 300 of FIG. 3 is shown in which details of N three-way elements of DAC 306 are illustrated. SAR ADC 30D has comparator 304, DAC 306 with N three-way elements, register 308 coupled to the N three-way elements, and SAR logic system 310 coupled together as shown in FIG. 4. FIG. 4 further illustrates DAC 306 having an R-2R ladder network of resistors R and 2R in order to convert digital signals to analog signals. The very last additional resistor 2R in the R-2R ladder network is coupled to the middle reference voltage VRMID. The remaining resistors 2R (e.g., first to Nth resistors 2R) having end nodes that provide the N three-way elements can be coupled to either the high reference voltage VR+, the middle reference voltage VRMID, or the low reference voltage VR−. Although exemplary DAC 306 is shown to be implemented with an R-2R ladder network, other ways of implementing DAC 306 can be utilized. For example, switched capacitors can be easily used instead of the R-2R ladder network of resistors R and 2R for implementing the DAC 306.

As also shown in FIG. 4, the N three-way elements of DAC 306 are able to couple to the high reference voltage VR+, the middle reference voltage VRMID, or the low reference voltage VR−. In other words, the N three-way elements are each able to be one of three values. Each of the N three-way elements is coupled to a respective three-way switch a1, . . . , am, an as shown in FIG. 4. Three-way switch a1, . . . , am, an switches and enables the corresponding three-way element to be either coupled to the high reference voltage VR+, the low reference voltage VR−, or the middle reference voltage VRMID. For example, three-way switch a1 is switched to couple its corresponding three-way element to the high reference voltage VR+, three-way switch am is switched to couple its respective three-way element to the low reference voltage VR−, and three-way switch an is switched to couple its corresponding three-way element to the middle reference voltage VRMID.

Figure 5:
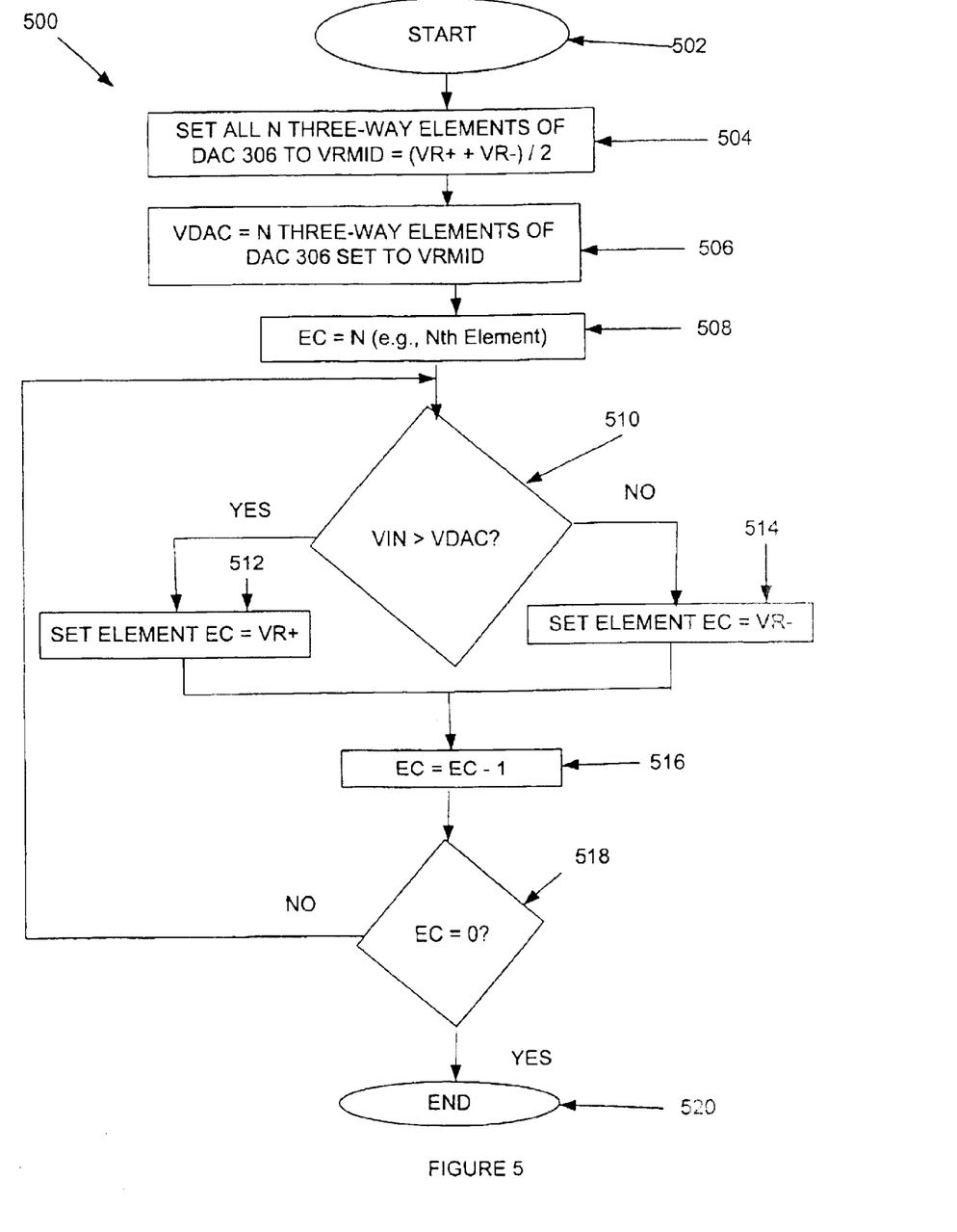
FIG. 5 is a flow chart of an exemplary efficient search algorithm for the SAR ADC of FIGS. 3 and 4 having the DAC with at least N three-way elements according to the present invention.

With reference now to FIG. 5, a flow chart of an exemplary efficient search algorithm 500 that is implemented by SAR logic system 310 of SAR ADC 300 having DAC 306 with N three-way elements according to the present invention is shown. In this example, N represents all of the DAC elements of DAC 306. However, search algorithm 500 can easily be modified or adapted for N representing a number less than all of the DAC elements of DAC 306. SAR logic system 310 has a memory medium for storing the instructions, operations, and steps of efficient search algorithm 500. Search algorithm 500 starts at block 502 and moves onto block 504. Block 504 depicts all of the N three-way elements of DAC 306 being initialized to the middle reference voltage VRMID=(VR++VR−)/2. Following block 504, block 506 illustrates DAC voltage VDAC being initialized to a voltage value that equates to all N three-way elements of DAC 306 being set to middle reference voltage VRMID.

Search algorithm 500 then proceeds from block 506 to block 508, which depicts an element count EC initialized to the N value, which at this point represents the Nth three-way element or the three-way element representing the "most significant bit" ("MSB") of DAC 306. Following block 508, decision block 510 shows a comparison being made as to whether analog input voltage VIN from analog input signal ANALOG IN is greater than DAC voltage VDAC. If analog input voltage VIN is greater than DAC voltage VDAC, then search algorithm 500 moves from decision block 510 to block 512. Block 512 shows ELEMENT EC (e.g., ELEMENT N in this initial case), which is the element that corresponds to the element count EC value, being set to high reference voltage VR+ (which is representative of the element being set to the one or high value). Search algorithm 500 then proceeds to block 516 and continues therefrom. On the other hand, if, at decision block 510, analog input voltage VIN is not greater than DAC voltage VDAC, then search algorithm 500 instead proceeds from decision block 510 to block 514. Block 514 depicts ELEMENT EC (e.g., ELEMENT N in this case) being set to low reference voltage VR− (which is representative of the element being set to the zero or low value). Search algorithm 500 then proceeds to block 516 and continues therefrom.

Block 516 represents the moving onto the next element of the N elements by setting the next value for element count EC being set to current element count EC minus one (e.g., EC=EC−1). In other words, the next value of element count EC will be set to N−1, N−2, etc. for future iterations of the loop of search algorithm 500 in setting values of the next elements. After block 516, decision block 518 represents a determination being made as to whether element count EC has reached zero (0). If, at decision block 518, element count EC does not equal zero (0), then search algorithm 500 loops back before decision block 510 and continues search algorithm 500 for the next element (e.g., the new element count EC). This looping back to decision block 510 signifies that a remaining next element(s) still need(s) to be set from the middle reference voltage VRMID to either a corresponding high reference voltage VR+ or low reference voltage VR− based upon the result of the comparison at decision block 510.

However, if, at block 518, element count EC does equal zero (0), then search algorithm 500 ends at block 520. The ending of search algorithm 500 signifies that all of the elements of N three-way elements have been set from the middle reference to either a corresponding high reference voltage VR+ or low reference voltage VR−. After all of the N three-way elements have been set to either a corresponding high reference voltage VR+ or low reference voltage VR− from the middle reference voltage VRMID, DAC voltage VDAC in this example has then been determined and set (e.g., successively approximated) at the desired value for the analog input voltage VIN.

For the same example discussed earlier, SAR ADC 300 has a DAC 306 with four (4) three-way elements (e.g. N=4), and the four element levels are from 0 to 15. In this example, analog input voltage VIN equates to a level value of 9.5. All of the N three-way elements of DAC 306 are initialized to middle reference voltage VRMID at block 504. The N elements may be initially represented by MMMM where M represents the middle value between 0 and 1. Also, during this initial point, all three-way switches a1, . . . , am, an of SAR ADC 300 are switched to couple each element to middle voltage reference VRMID. DAC voltage VDAC is initialized to a voltage value equivalent to all of the N three-way elements being set to the middle reference voltage VRMID (e.g., MMMM) at block 506. The equivalent middle reference voltage value for DAC voltage VDAC is 8 in this example. Element count EC is set equal to 4 at block 508. Since 9.5>8 at decision block 510, element 4 is set to the one value (e.g., switch a1 is switched to couple element 4 to high reference voltage VR+ in SAR ADC 300 of FIG. 4) at block 512. Element count EC is next set to 3 (e.g., 4−1) at block 516.

Since element count EC does not equal zero at decision block 518, search algorithm 500 loops back to decision block 510. At this time, DAC voltage VDAC is now 12 and the element values are 1 MMM. Since 9.5<12, then element 3 is set equal to the zero value at block 514 (e.g., switch a2 is switched to couple element 3 to low reference voltage VR− in SAR ADC 300 of FIG. 4). Element count EC is then set to 2 (e.g., 3−1) at block 516. Since element count EC still does not equal zero at decision block 518, search algorithm 500 again loops back to decision block 510. Now at this time, DAC voltage VDAC is now 10 and the element values are 10 MM. Since 9.5 is not greater than 10, then element 2 is set equal to the zero value at block 514 (e.g., switch a3 is switched to couple element 2 to low reference voltage VR− in SAR ADC 300 of FIG. 4). Element count EC is next set to 1 (e.g., 2−1) at block 516. Since element count EC still does not equal zero at decision block 518, search algorithm 500 loops back to decision block 510. DAC voltage VDAC is now 9 and the element values are 100 M). Since 9.5>9, then element 1 is set equal to the one value at block 514 (e.g., switch a4 is switched to couple element 1 to high reference voltage VR+ in SAR ADC 300 of FIG. 4). Element count EC is then set equal to 0 (e.g., 1−1) at block 516. Since element count EC is now 0, search algorithm 500 ends at block 520. DAC voltage VDAC is now set with the desired value of 9, and the element values are set at 1001.

In summary, the present invention provides a SAR ADC that implements a more efficient search algorithm. The efficient search algorithm reduces the number of changes having to be made to the element values. The present invention also reduces the number of steps and operations that the search algorithm for the SAR ADC has to perform and the number of passes that have to be made through the search algorithm loop. The present invention overcomes the problems and disadvantages that have been encountered with the prior art.

While the invention has been particularly shown and described with reference to a preferred embodiment, it will be understood by those skilled in the art that various changes in form and detail may be made therein without departing from the spirit and scope of the invention.

What is claimed is:

1. A search algorithm for a successive-approximation-register (SAR) analog-to-digital converter (ADC), comprising:

initializing each of N three-way elements of a digital-to-analog converter (DAC) for a SAR ADC to a middle reference voltage wherein the N three-way elements of the DAC are each able to be set to one of three values; and determining and setting the each of the N three-way elements from the middle reference voltage to either a high reference voltage or a low reference voltage depending upon a comparison result between an analog input value of the SAR ADC and a DAC voltage value of the DAC.

2. The search algorithm according to claim 1, wherein the determining and setting step further comprises:

determining whether the analog input value is greater than the DAC voltage value based on element values of the DAC;

in response to the analog input value being greater than the DAC voltage value, switching a three-way element to be switched from the middle reference voltage to a high reference voltage; and in response to the analog input value not being greater than the DAC voltage value, switching the three-way element to be switched from the middle reference voltage to a low reference voltage.

3. The search algorithm according to claim 2, further comprising:

setting an element count value to an N value wherein the three-way element to be switched from the middle reference voltage is the element corresponding to the element count value;

performing the determining and switching steps for the element corresponding to the element count value in setting the three-way element from the middle reference voltage to either the high reference voltage or the low reference voltage; and subtracting the element count value by one and repeating the determining and switching and subtracting steps for setting each of the N three-way elements from the middle reference voltage to either the high reference voltage or the low reference voltage until the element count value equals zero.

4. The search algorithm according to claim 3, wherein the initializing and switching steps further comprises:

three-way switching each of the N three-way elements to either the middle reference voltage, the high reference voltage, or the low reference voltage.

5. A successive-approximation-register (SAR) analog-to-digital converter (ADC), comprising:

a digital-to-analog converter (DAC) having N three-way elements wherein the DAC converts digital signals to analog signals and N is an integer greater than one;

a register coupled to the N three-way elements wherein each of the N three-way elements is able to be set to one of three values;

three way switches that three-way switch and couple each of the N three-way elements to either a high reference voltage, a middle reference voltage, or a low reference voltage;

a successive-approximation-register (SAR) logic system coupled to the register; and a comparator for receiving and comparing an analog input value and a DAC output value from the DAC and for providing a comparator output signal that is fed into the SAR logic system.

6. The SAR ADC according to claim 5, wherein the SAR logic system:

initializes each of the N three-way elements of the DAC to a middle reference voltage; and determines and sets the each of the N three-way elements from the middle reference voltage to either a high reference voltage or a low reference voltage depending upon a comparison result between the analog input value and the DAC output value.

7. The SAR ADC according to claim 6, wherein the SAR logic system further:

determines whether the analog input value is greater than the DAC output value based on elements values of the DAC;

in response to the analog input value being greater than the DAC output value, switches a three-way element to be switched from the middle reference voltage to a high reference voltage; and in response to the analog input value not being greater than the DAC output value, switches the three-way element to be switched from the middle reference voltage to a low reference voltage.

8. The SAR ADC according to claim 7, wherein the SAR logic system:

sets an element count value to an N value wherein the three-way element to be switched from the middle reference voltage is the element corresponding to the element count value;

performs the determination and switching for the element corresponding to the element count value in setting the element from the middle reference voltage to either the high reference voltage or the low reference voltage; and subtracts the element count value by one and repeats the determination and switching and subtraction for setting each of the N three-way elements from the middle reference voltage to either the high reference voltage or the low reference voltage until the element count value equals zero.

9. The SAR ADC according to claim 8, wherein the SAR logic system further:

three-way switches each of the N three-way elements between either the middle reference voltage, the high reference voltage, or the low reference voltage.

10. A successive-approximation-register (SAR) algorithm for a SAR logic system of a SAR analog-to-digital converter (ADC), comprising:

a. a memory medium; and b. a successive-approximation-register (SAR) algorithm stored on said memory medium, said SAR algorithm comprising instructions for:

i. initializing each of N three-way elements of a digital-to-analog converter (DAC) for the SAR ADC to a middle reference voltage wherein the N three-way elements of the DAC are each able to be set to one of three values; and ii. determining and setting the each of the N three-way elements from the middle reference voltage to either a high reference voltage or a low reference voltage depending upon a comparison result between an analog input value of the SAR ADC and a DAC voltage value of the DAC.

11. The SAR algorithm according to claim 10, wherein the determining and setting instruction further comprises instructions for:
   determining whether the analog input value is greater then the DAC voltage value based on element values of the DAC;
   in response to the analog input value being greater than the DAC voltage value, switching a three-way element to be switched from the middle reference voltage to a high reference voltage; and
   in response to the analog input value not being greater than the DAC voltage value, switching the three-way element to be switched from the middle reference voltage to a low reference voltage.

12. The SAR algorithm according to claim 11, further comprising instructions for:
   setting an element count value to an N value wherein the three-way element to be switched from the middle reference voltage is the element corresponding to the element count value;
   performing the determining and switching instructions for the element corresponding to the element count value in setting the element from the middle reference voltage to either the high reference voltage or the low reference voltage; and
   subtracting the element count value by one and repeating the determining and switching and subtracting instructions for setting each of the N three way elements from the middle reference voltage to either the high reference voltage or the low reference voltage until the element count value equals zero.

13. The SAR algorithm according to claim 12, wherein the initializing and switching instructions further comprises the instruction for:
   three-way switching each of the N three-way elements between either the middle reference voltage, the high reference voltage, or the low reference voltage.

14. A three-way element for a digital device, comprising:
   an element having at least three states and wherein the at least three states include at least a low state, a middle state, and a high state; and
   wherein the three-way element having the at least three states is utilized in conjunction with a three-way switch that three-way switches and sets the three-way element to one of the at least three states.

15. The three-way element for a digital device according to claim 14, wherein the middle state is utilized as an initial state by a successive-approximation-register (SAR) algorithm and the SAR algorithm determines whether the three-way element is to be switched from the middle state to either the low state or the high state.

16. The three-way element for a digital device according to claim 14, wherein the three-way element having the at least three states is utilized in a digital-to-analog converter.

17. The three-way element for a digital device according to claim 14, wherein the three-way element having the at least three states is utilized in a register.

* * * * *